United States Patent [19]
Kuo

[11] Patent Number: 5,773,329
[45] Date of Patent: Jun. 30, 1998

[54] POLYSILICON GROWN BY PULSED RAPID THERMAL ANNEALING

[75] Inventor: Yue Kuo, Chappaqua, N.Y.

[73] Assignee: International Business Machines Corporation, Armonk, N.Y.

[21] Appl. No.: 685,728

[22] Filed: Jul. 24, 1996

[51] Int. Cl.[6] .................................................. H01L 21/268
[52] U.S. Cl. .......................... 438/162; 438/166; 438/487; 148/DIG. 4; 148/DIG. 16
[58] Field of Search ..................................... 438/162, 166, 438/308, 486, 487, 795, 453, 155, 153, 183, 184, 200, 201, 334; 148/DIG. 4, DIG. 16

[56] References Cited

U.S. PATENT DOCUMENTS

| | | | |
|---|---|---|---|
| 4,751,193 | 6/1988 | Myrick | 437/19 |
| 5,147,826 | 9/1992 | Liu et al. | 437/233 |
| 5,481,121 | 1/1996 | Zhang et al. | 257/72 |
| 5,543,352 | 8/1996 | Ohtani et al. | 437/173 |
| 5,569,610 | 10/1996 | Zhang et al. | 437/21 |

FOREIGN PATENT DOCUMENTS 7-37822  2/1995  Japan .

OTHER PUBLICATIONS

G. Liu et al., Appl. Phys. Lett. 5567)(1989)660 "Selective area crystallization of a–Si by low temperature RTA" Aug. 1989.

R. Kakkad et al., J. Non–Cryst. Solids 115(1989)66 "Low temperature selective crystallization of a–Si" 1989.

Atsushi Kohno et al., "High Performance Poly–Si TFTs Fabricated Using Pulsed Laser Annealing and Remote Plasma CVD with Low Temp. Processing", IEEE Trans. on Electon Devices, V. 42, No. 2, Feb. 95, pp. 251–257.

Hiroshi Tanabe et al., "Excimer Laser Crystallization of Amorphous Silicon Films", NEC Res. & Dev., Vo. 35, No. 3, Jul. 1994, pp. 254–260.

(List continued on next page.)

*Primary Examiner*—Charles L. Bowers, Jr.
*Assistant Examiner*—Leon Radomsky
*Attorney, Agent, or Firm*—Scully, Scott, Murphy & Presser

[57] ABSTRACT

A method of low temperature and rapid silicon crystallization or rapid transformation of amorphous silicon to high quality polysilicon over a large area is disclosed using a pulsed rapid thermal annealing (PRTA) method and a metal seed layer. The PRTA method forms polysilicon thin film transistors (TFTs) with a high throughput, on low temperature and large area glass substrates. The PRTA method includes the steps of forming over a glass layer a tri-layer structure having a layer of amorphous silicon sandwiched between bottom and top dielectric layers; selectively etching the top dielectric layer to expose portions of the amorphous silicon layer; forming a metal seed layer over the exposed portions of the amorphous silicon layer; and pulsed rapid thermal annealing using successive pulses separated by rest periods to transform the amorphous silicon layer to a polysilicon layer. In an alternate PRTA method, instead of forming the tri-layer structure, a bi-layer structure is formded over the glass layer. The bi-layer structure does not have the top dielectric layer of the tri-layer structure. The bi-layer structure includes dielectric and amorphous silicon layers.

17 Claims, 10 Drawing Sheets

OTHER PUBLICATIONS

Kikuyo Ono et al., "Effect of Channel Implantation on the Device Performance of Low Temperature Processed Polycryst. Silicon Thin Films Transistors", Japan. Jour. of Applied Physics, vol. 29, No. 12, Dec. 90, pp. 2705–2710.

Madeline Bonnel et al., "Poly–si Thin Film Trans, Fabricated with Rapid Thermal Annealed Silicon Films", Japan. Jour of Applied Physics, vol. 30, No. 11B, Nov. 91, pp. L 1924–L 1926.

Gang liu et al., "Polycrystalline Silicon Thin Film trans, on Corning 7059 Glass Substrates using Short Time, Low–Temperature Processing", App. Phys. Lett. 62(20), May 93, pp. 2554–2556.

Yue Kuo, "Thin Film Transistors Technologies", The Electrochemical Society Proceedings vol. 94–35, pp pp. 115–125.

Steve Jurichich et al., "Low Thermal Budget Polycrystalline Silicon–Germanium Thin–Film Trans. Fabricated by Rapid Thermal Annealing", Jpn. J. Appl. Phys., vol. 33 (1994), Aug. 94, pp. L 1139 L 1141.

Yue Kuo, "Thin–Film Trans. with Multistep Deposited Amorphous Silicon Layers", Appl. Phys. Lett. 67(15), Oct. 95, pp. 2173–2175.

Y. Kuo, et al., "Reactive Ion Etching of PECVD n+ a–Si:H Plasma Damage to PECVD Silicon Nitride Film and Application to Thin Film Transistor Preparation", J. Electrochem. Soc. vol. 139, Feb. 92, pp. 548–552.

H. Richter et al., "The One Phonon Raman Spectrum in Microcrystalline Silicon", Solid State Communications, vol. 39, pp. 625–629.

R. Pretorius et al., "Evaluation of Anomalies During Nickel and Titanium Silicide Formation Model", Materials Chemistry and Physics, 1993, pp. 31–38.

Dexin, et al., "Titanium Silicides Formed by Rapid Thermal Vacuum Processing", J. Appl. Phys. Mar. 1990, pp. 2171–2173.

Losch et al., "Microstructure of the Pd/a–Si:H Interface", Journal of Non–Crystalline Solids 77 & 78, 1985, pp. 1019–1022.

POLYSILICON GROWN BY PULSED RAPID THERMAL ANNEALING

BACKGROUND OF THE INVENTION

1. Field of the Invention

The present invention is directed to a method for rapidly forming polysilicon from amorphous silicon, and more particularly, to a pulsed rapid thermal annealing method using a contact metal as a seed.

2. Discussion of the Prior Art

Thin film transistors (TFTs) are critical devices for a high performance liquid crystal display (LCD), which is one of the most important component for computers. TFTs are also applied to other two dimensional (2D) imagers, sensors, and electronic equipment. Currently, most large area arrays of TFTS are based on amorphous materials, such as a hydrogen amorphous silicon a-Si:H. The a-Si:H TFT has, however, some intrinsic drawbacks, e.g., low mobility and high photosensitivity. Therefore, several extra process steps have to be added to the manufacturing procedure to avoid these problems. For example, a black matrix has to be used to block light from reaching the TFTS. Drivers for a display have to be fabricated separately from an array of TFTs.

To avoid the problems associated with a-Si:H based TFTs, polysilicon TFTs are used. One of the major drawbacks of a polysilicon TFT is the high leakage current. Proper design of the polysilicon TFT structure minimizes the leakage current. Display panel fabrication procedure is simplified and cost is reduced where all the driver circuits are integrated into the pixel TFT fabrication process. However, a major problem in fabricating polysilicon TFTs is the formation of polysilicon under certain conditions which include:

1) a low temperature, such as less than 550° C. on a low temperature glass;
2) on a large piece of glass substrate; and
3) with a high throughput.

Therefore, high temperature processes are not suitable for low temperature glass.

Several methods, including laser crystallization, furnace annealing and reactive chemical vapor deposition have been reported for the preparation of polysilicon. These methods require either high temperature or a long process time. In some cases, uniformity over a large area is not achieved. Therefore, using conventional methods, high quality polysilicon cannot be formed in an efficient manner.

For example, the laser annealing method can supply polysilicon with low defect densities within grains. Such a laser annealing method is disclosed in the following references:

1. A. Kohno, T. Sameshima, N. Sano, M. Sekiya, and M. Hara, IEEE Trans. Electron Devices 42 (2), 251 (1995); and
2. H. Tanabe, K. Sera, K. Nakamura, K. Hirata, K. Yuda, and F. Okumura, NEC Res. & Dev. 35 (3), 254 (1994).

In laser polysiliconization methods, a laser beam size is usually small, e.g., less than 1 cm by 1 cm. Therefore, it takes a long time to scan through a large area.

In another polysilicon crystallization method, a low-temperature, e.g., 600° C., furnace annealing method is used to crystallize silicon. Such a method is discussed in the following reference, which is incorporated herein by reference:

3. K. Ono, S. Oikawa, N. Konishi, and K. Miyata, Jpn. J. Appl. Phys. 29, 2705 (1990).

With respect to methods using reactive chemical vapor deposition, there are reports on direct deposition of poly-crystalline or microcrystalline silicon films at a temperature lower than 500° C. by adding hydrogen-, fluorine-, or chlorine-containing gases to the silicon source in the chemical vapor deposition (CVD) process. Most of the films formed by such a reactive CVD process have a columnar structure with rough topography. It is difficult to obtain a good polysilicon film uniformity over a large substrate area with this kind of reactive CVD. Thus, highly reactive CVD processes cannot provide good quality polysilicon film over a large area.

The following references discuss polysilicon formation processes:

4. M. Bonnel, N. Duhamel, M. Guendouz, L. Haji, B. Loisel, and P. Ruault, Jpn. J. Appl. Phys. 30 (1B), L 1924 (1991);
5. G. Liu and S. J. Fonash, Appl. Phys. Lett. 62, 22554 (1993); and
6. S. W. Lee, Y. C. Jeon, and S. K. Joo, ECS Proceedings of 2nd Thin Film Transistor Technologies, edited by Y. Kuo, (Electrochemical Society, Pennington, N.J. (1994), Vol. 94–35, p. 115.

When a proper metal is in contact with the original amorphous silicon, both the temperature and the time of the crystallization can be shortened. For example, the Bonnel, et al. reference showed that polysilicon could be formed in 40 seconds at 750° C. when the amorphous silicon was in contact with indium tin oxide (ITO). The Liu et al. reference reported that when a thin layer, i.e., 40 Å, of palladium (Pd) was deposited underneath an amorphous silicon, the crystallization could be carried out in 2 hours at 600° C. The Lee, et al. reference demonstrated that silicon could be crystallized laterally from the Pd contact area. Although the growth temperature was low, i.e., 500° C., it took 10 hours to fully crystallize an area of 100 micrometers by 100 micrometers.

These conventional processes are not practical for the mass production of TFTs on a low temperature glass, such as Corning 7059, because either the temperature is too high or the process time is too long.

SUMMARY OF THE INVENTION

The inventive method provide rapid silicon crystallization and rapid transformation of amorphous silicon to polysilicon. This is accomplished by a pulsed rapid thermal annealing (PRTA) method performed on a semiconductor having a metal-silicon contact structure, where the metal acts as a seed layer to transform the amorphous silicon to polysilicon.

The object of the present invention is to provide a method of forming polysilicon that eliminates the problems of conventional methods.

Another object of the present invention is to form polysilicon from amorphous silicon in a short period of time.

Yet another object of the present invention is to form polysilicon on a low temperature substrate.

A further object of the present invention is to form polysilicon thin film transistors (TFTs) with a high throughput, on low temperature large area glass substrates.

These and other objects of the present invention are achieved by a method for forming a semiconductor device having a polysilicon channel comprising the steps of:

(a) forming over a glass layer a tri-layer structure having a layer of amorphous silicon sandwiched between bottom and top dielectric layers;
(b) selectively etching the top dielectric layer to expose portions of the amorphous silicon layer;
(c) forming a metal seed layer over the exposed portions of the amorphous silicon layer; and (d) pulsed rapid thermal annealing using successive pulses separated by rest periods to transform the amorphous silicon layer to a polysilicon layer.

The metal seed layer may be comprised of metals such as nickel, titanium or palladium metal. Illustratively, the forming step forms the tri-layer over a glass having a predetermined strain temperature, and the annealing step anneals at a temperature exceeding said predetermined strain temperature.

The annealing step provides the successive pulses having a duration of approximately one second separated by approximately five seconds. For example, the annealing step forms a 50 μm long polysilicon layer using nickel seed metal and five successive pulses.

Furnace annealing may be performed after the etching step. The etching step comprises the steps of:

forming mask over portions of the top dielectric layer;

etching unmasked portions of the top dielectric layer; and removing the mask.

The etching step may also include an initial furnace annealing, followed by forming a heavily doped silicon layer over the exposed portions of the amorphous silicon layer. In addition, the following steps may be performed, after the pulsed rapid thermal annealing step:

forming an insulating layer over the metal seed layer and the top dielectric layer; and forming a gate of the semiconductor device over the insulating layer.

Instead of a top gate, a bottom gate may be formed. For example, the bottom gate may be formed over the glass layer before the step of forming the tri-layer structure.

In another embodiment of the present invention using PRTA, instead of forming the tri-layer structure, a bi-layer structure is formded over the glass layer. The bi-layer structure does not have the top dielectric layer of the tri-layer structure. The bi-layer structure includes dielectric and amorphous silicon layers.

BRIEF DESCRIPTION OF THE DRAWINGS

Further features and advantages of the invention will become more readily apparent from a consideration of the following detailed description set forth with reference to the accompanying drawings, which specify and show preferred embodiments of the invention, wherein like elements are designated by identical references throughout the drawings; and in which.

DETAILED DESCRIPTION OF THE INVENTION

In one embodiment of the present invention a pulsed rapid thermal annealing (PRTA) method is used to transform amorphous silicon, such as a-Si:H, to polysilicon. The PRTA is a solid phase, crystallization method and includes several short heating-cooling cycles. The heating time in each cycle is very short, such as approximately 1 second, and the cooling time is longer, such as several seconds.

Figure 1A:
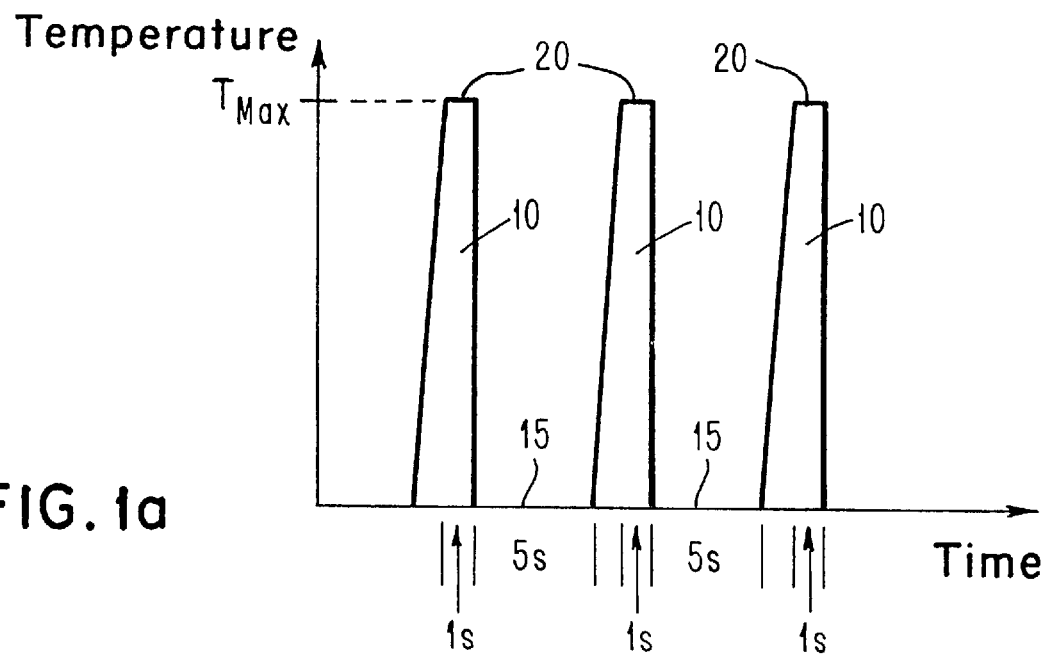
FIGS. 1a and 1b show plots of programmed and actual temperature patterns verses time, in accordance with the present invention.
Figure 1B:
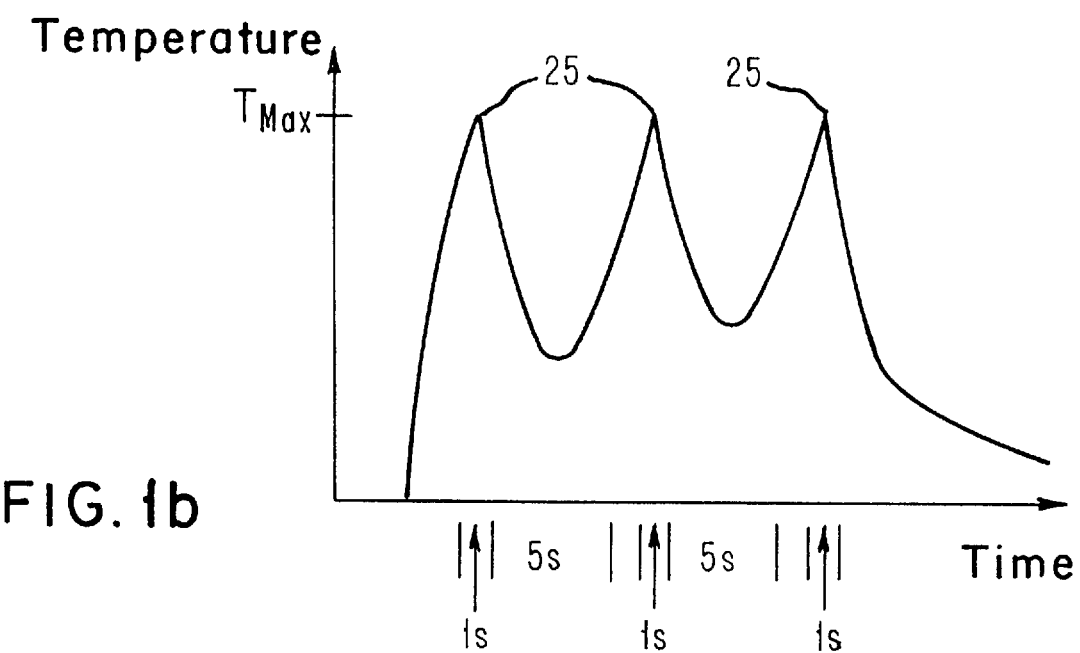

FIGS. 1a and 1b show programmed and actual temperature-time diagrams of a 3-pulse PRTA process. As shown in FIG 1a, each of the three heating pulses 10 have a duration of approximately 1 second near the highest temperature Tmax, and are separated by rest or cooling periods, of approximately 5 seconds. Thus, in each cycle, a semiconductor device is exposed to the highest temperature Tmax for less than 1 second, as seen from the actual peaks 25 in FIG 1b, corresponding to the programmed peaks 20 of FIG 1a.

The cooling time is adjustable so that the semiconductor deceive is kept at a raised temperature between two heat pulses 10. Since the heating period is very short (e.g., less than 1 second), a low temperature glass may be exposed to a high temperature with minimal damage.

Thus, a glass having a predetermined strain temperature may be used with heating PRTA pulses having temperatures that exceed the predetermined strain temperature of the glass without damaging the glass. In contrast, low temperature furnace annealing requires a long anneal time. For example, a low temperature glass having a strain temperature of 630° C., can be exposed to 740° C. for 1 or 2 seconds with minimum warpage. This is discussed in the following reference, which is incorporated herein by reference:

7. S. Jurichich, T. J. King, K. Saraswat, and J. Mehlhaff, Jpn. J. Appl. Phys. 33 (2), 8B, L 1139 (1994).

The heating and cooling parameters of a PRTA process are adjusted to minimize the glass warpage, where a semiconductor device, including the glass, is exposed to a high temperature for a short period of time.

A semiconductor device, such as a thin film transistor (TFT), is fabricated with the following steps, where a polysilicon channel as long as 50 micrometers ($\mu$m) is formed in less than 30 seconds using five successive one second anneal pulses separated by approximately five seconds.

Figure 2A:
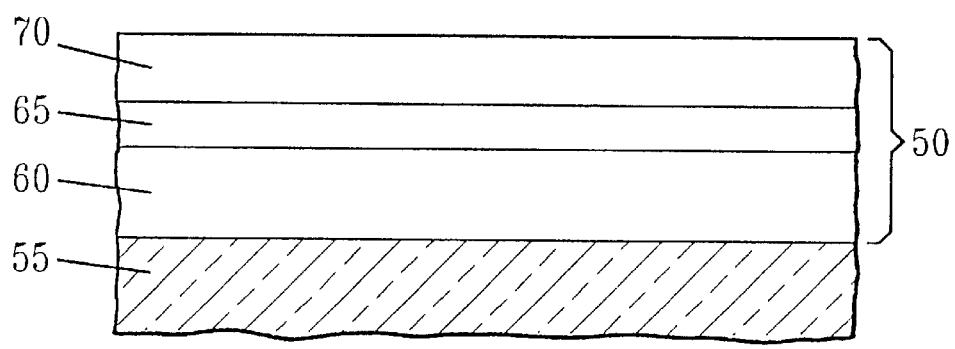
FIGS. 2a–2i show a pulsed rapid thermal annealing process in accordance with the present invention.

As shown in FIG. 2a, a 3-layer structure 50 is formed on a low temperature glass 55, using, for example, 250° C. plasma enhanced chemical vapor deposition (PECVD). Such a process is described in the following reference, which is incorporated herein by references:

8. Y. Kuo, Appl. Phys. Lett. 67, 2173 (1995).

Illustratively, the low temperature glass 55 is a Corning 7059 glass, and the tri-layer structure 50 is $SiN_x$/a-Si:H/$SiN_x$ having thickness of 2000 Å/600 Å/1000 Å, respectively. These layers are referenced as 60, 65, 70, respectively in FIG. 2a. Other dielectric material, such as oxides of silicon $SiO_x$ or tantalum $Ta_2O_5$, may be used instead of the bottom and top $SiN_x$ layers 60, 70. The middle layer 65, which is sandwiched between the two dielectric layers 60, 70 is a hydrogenated amorphous silicon a-Si:H layer.

Figure 2B:
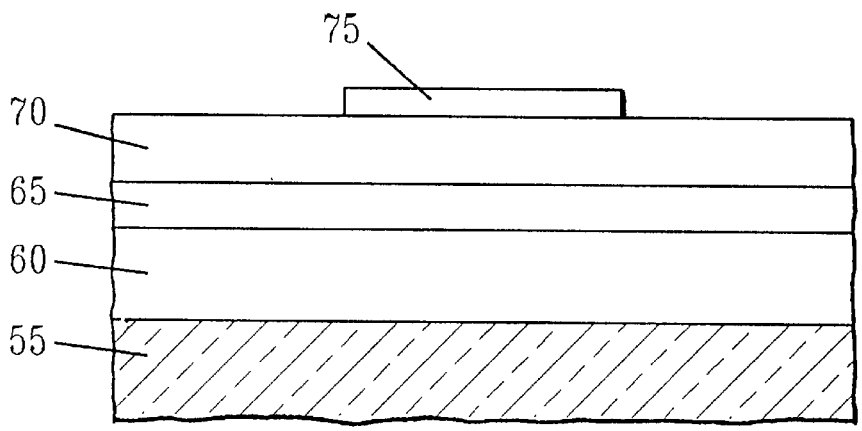
Figure 2C:
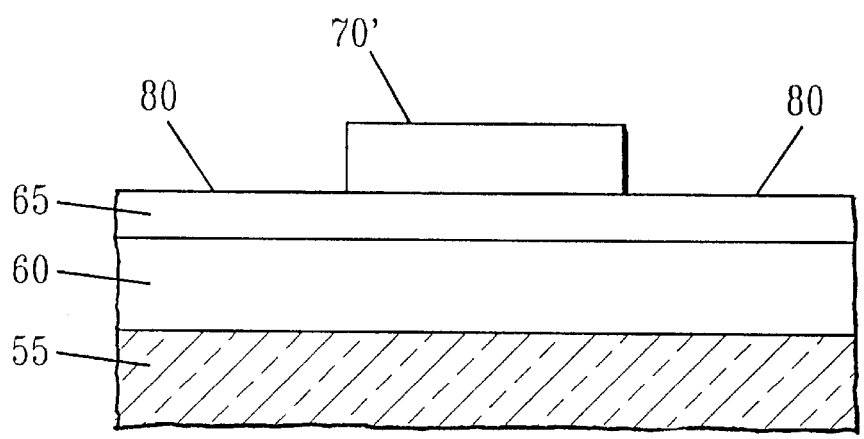

As shown in FIG. 2b, a first mask is formed over the top dielectric layer 70, which is etched to expose portions 80 of the amorphous silicon layer 65 as shown in FIG. 2c. Etching the top dielectrcc layer 70 forms a top dielectric section 70'. Conventional etching solutions may be used to expose the portions 80 and form the top dielectric section 70'. The mask 75 is removed upon completion of the etching. At this state, an optional annealing of the structure shown in FIG. 2c may be performed. Illustratively, this annealing is performed at 500° C., for approximately 3 hours.

Figure 2D:
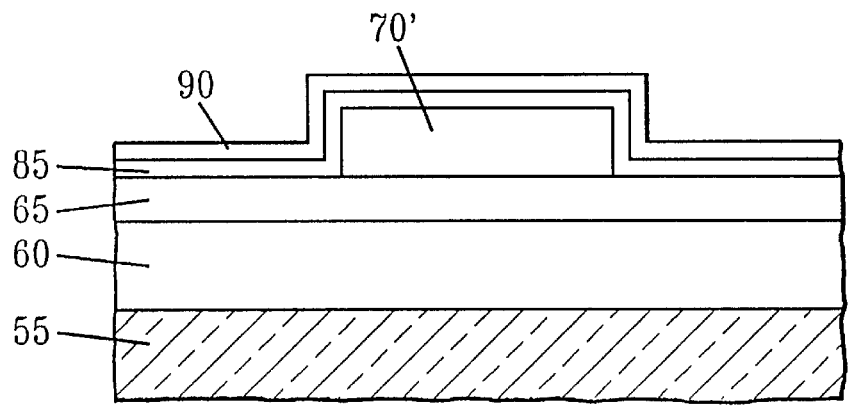

As shown in FIG. 2d, as heavily doped layer 85 of silicon is formed over the top dielectric section 70' and exposed portions of the amorphous silicon layer 65. Illustratively, this silicon layer 85 is deposited using a PECVD process and doped with phosporus to form $n^+$ Si layer 85. Alternatively, the PECVD $n^+$ deposition step may be replaced by an ion implantation or a non-mass-separation ion shower implantation step. The thickness of the heavily doped layer 85 is 250 Å, for example. Next, a seed metal layer 90 is deposited over the heavily doped layer 85. Illustratively, the seed metal layer 90 has a thickness of 100 Å and is nickel (Ni), titanium (Ti) or paladium (Pd). Alternatively, the heavily doped layer 85 may be omitted, and the metal layer 90 may be formed directly over the amorphous silicon layer 65. An advantage of having the heavily doped layer 85 is ohmic contacts formation which is important for the high performance transistor. Another advantage of having the heavily doped layer 85 includes enhanced silicide formation in the heavily doped layer 85 under raised temperatures.

The silicide acts as a seed layer for polysilicon growth or transformation of the amorphous silicon layer 60 to a polysilicon layer as described below.

Figure 2E:
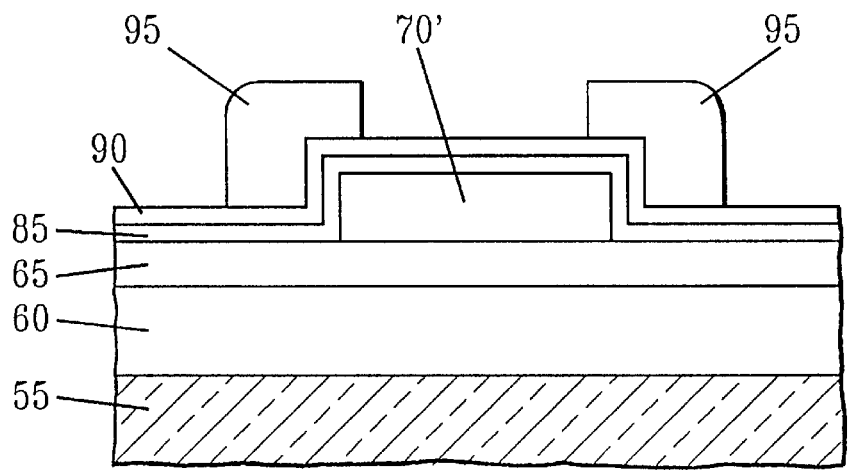

As shown in FIG. 2e, a second mask 95, such as a photo resist, is applied to define the metal area. Portions of the metal layer 90 not covered by the second mask 95 are etched. In addition, regions of the $n^+$ and silicon layers 85, 65, not covered by the metal layer 90 or the top dielectric section 70', is etched, e.g., by reactive ion etching (RIE), using the same second mask 95. Such an RIE process is described in the following reference, which is incorporated herein by reference:

9. Y. Kuo, J. Electrochem. Soc. 139,548 (1992).

Figure 2F:
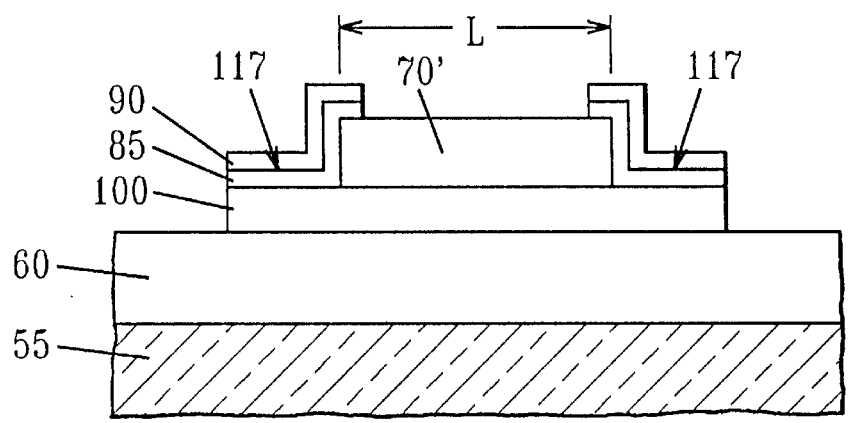

As shown in FIG. 2f, the second mask 95 is removed. The silicon etching by the RIE step forms an amorphous silicon island 100 from the amorphous silicon layer 65. This island 100 contains the channel area for the TFT. Illustratively, the channel length L is between 7 μm and 50 μm, and the channel width W (not shown) is either 70 μm or 76 μm.

Next, an annealing step may be performed to dehydrogenate the $n^+$ layer 85 and the amorphous silicon island 100. Illustratively, the annealing is performed at approximately 500° C. for about 2 or 3 hours.

Upon annealing, the semiconductor device is exposed to PRTA, where the heating-cooling cycles are shown in FIGS. 1a, 1b.

In one illustrative example, each PRTA cycle comprises 1-second heating at 800° C. and 5-second cooling under nitrogen purge. The heating rate was set at 125° C./sec. A commercially available rapid thermal processor was used. For the purpose of comparison, the same thin film structure was annealed in a furnace at 500° C. for up to 40 hours. The annealed films using both PRTA and furnace annealing were examined under optical microscope and with micro-Raman spectroscope. The channel resistivity was measured.

Figure 2G:
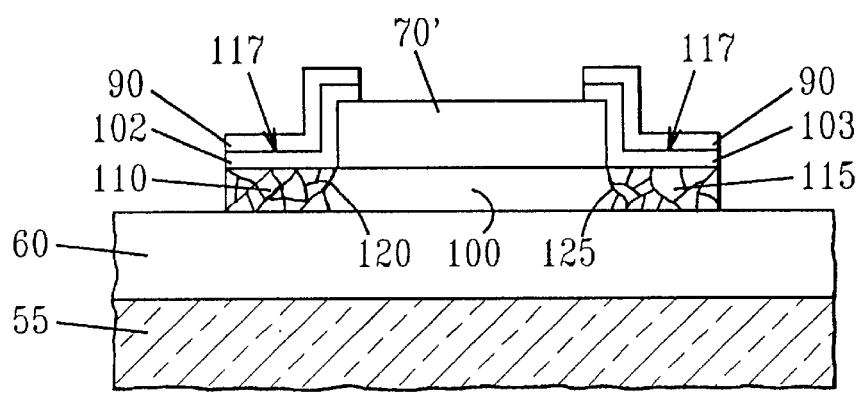

As shown in FIG. 2g, an examination of the device with a nickel (Ni) contact metal 90, after the first pulse annealing of the PRTA pulses shown in FIGS. 1a, 1b, indicates silicide formation in the heavily doped layer 85 (FIG. 2f). In the absence of the heavily doped silicon layer 85, silicide regions 102, 103 are formed between the metal and amorphous silicon layers 90, 100. In addition, FIG. 2g shows the presence of two new regions 110, 115 in the amorphous silicon island 100.

These new regions 110, 115 are polysilicon regions and start from the interface between the $n^+$ and metal layers 85, 90 shown in FIG. 2f. At this $n^+$/metal interface, contact edges 117 may be formed. In this case, the polysilicon regions 110, 115 of FIG. 2g start from the contact edges 117. The same new patterns is observed even without the $n^+$ layer 85 (FIG. 2f) between the Ni and silicon layers 90, 100.

Figure 2H:
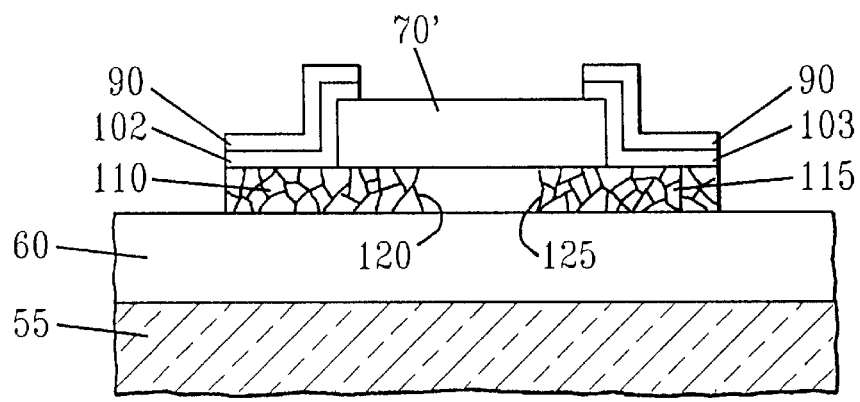
Figure 2I:
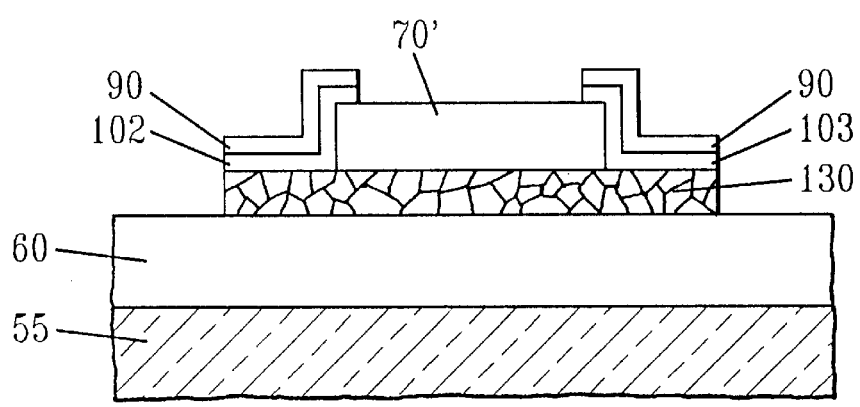

As shown in FIG. 2h, boundaries 120, 125 of the two polysilicon regions 110, 115 move toward the center of the amorphous silicon island 100 as additional PRTA pulses are applied in accordance with FIGS. 1a, 1b. As shown in FIGS. 2h and 2i, the two polysilicon regions 110, 115 grow laterally to eventually merge. This transforms the amorphous silicon to polysilicon and forms a polysilicon island 130, shown in FIG. 2i. For example, with the channel length of 12, 30 and 50 micrometers, these two lines 120, 125 merge after 1, 3 and 5 pulses, respectively.

In contrast, it takes 13 hours for the two polysilicon regions 110, 115 to merge in a 12-micrometer channel when the sample is annealed in a 500° C. furnace. Therefore, the annealing time is shortened by more than 4 orders of magnitude with the inventive PRTA method.

It is noteworthy that the amorphous silicon island 100 need not be totally crystallized and transformed to the polysilicon island 130. A small amorphous silicon region in the center of the polysilicon island 130 also confines the leakage current to low levels.

Figure 3A:
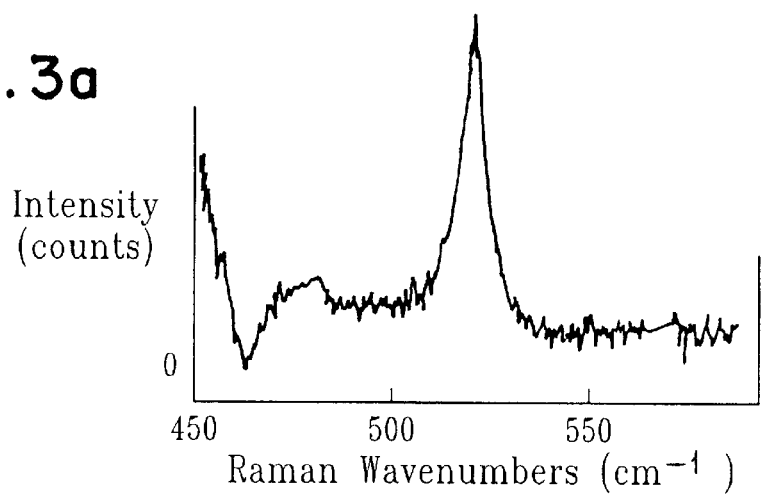
FIGS. 3a–3c show plots of Raman shifts comparing a polysilicon structure formed in accordance with the present invention with conventional structures.
Figure 3B:
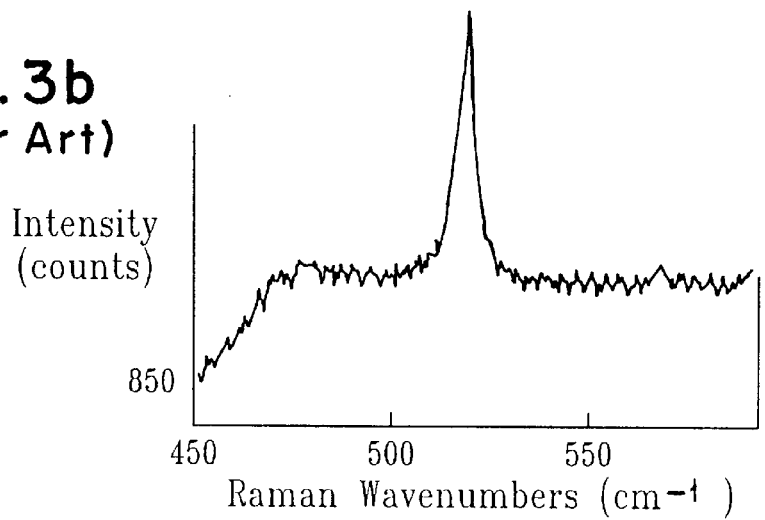
Figure 3C:
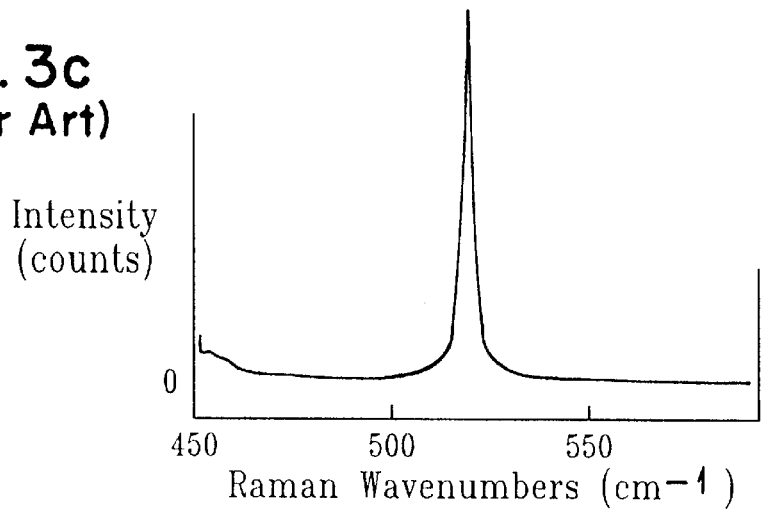

FIGS. 3a, 3b show Raman shifts of the Ni-induced growth regions 110, 115 (FIG. 2i) after a 10-pulse PRTA process and furnace annealing, respectively. FIG. 3c shows the Raman spectrum of a single crystalline silicon, which has a symmetric peak at 520.7 cm$^{-1}$. The Raman spectrum of the polysilicon film formed by the 10-pulse PRTA, shown in FIG. 3a, has a symmetric peak at 521.6 cm$^{-1}$. The peak indicates the existence of microcrystalline silicon, i.e., less than 100 Å in size, in the polysilicon island 130 of FIG. 2i.

Raman shift measurements are described in the following reference, which is incorporated herein by reference:

10. H. Richter, Z. P. Wang, and L. Ley, Solid State Communication 39, 625 (1981).

As shown in FIG. 3b, the furnace annealed film has an asymmetric peak at 519.9 cm$^{-1}$. This film contains microcrystalline silicon with grain size greater than 150 Å. The PRTA crystallized polysilicon film has different characteristics from the furnace crystallized film.

The silicon channel resistivity decreases with the increase of the number of pulses of the PRTA process. For example, resistivities of the 50 micrometer silicon channels are $4.1 \times 10^{12}$, $1.8 \times 10^{11}$, and $3.7 \times 10^{10}$ ohms before any pulses are applied, after 1- PRTA pulse, and after 3-pulse PRTAS, respectively. After 13 hours of furnace annealing at 500° C., the same channel has a resistivity of $2.0 \times 10^{11}$ ohms. This indicates that the polysilicon formation time of the PRTA process is much shorter than that of the low temperature furnace annealing process.

The resistivity of the channel structure is affected by three factors: the Ni/$n^+$ contact 90, 85 (FIG. 2f); the silicon structure in the channel area; and the a-Si 100 to SiN$_x$ 70' interfaces. The high temperature pulse in PRTA facilitates the Ni silicide formation which lowers the Ni/Si contact resistance.

The PRTA pulses cause silicide formation, initial transformation for amorphous silicon to polysilicon, and lateral growth of polysilicon.

Figure 4:
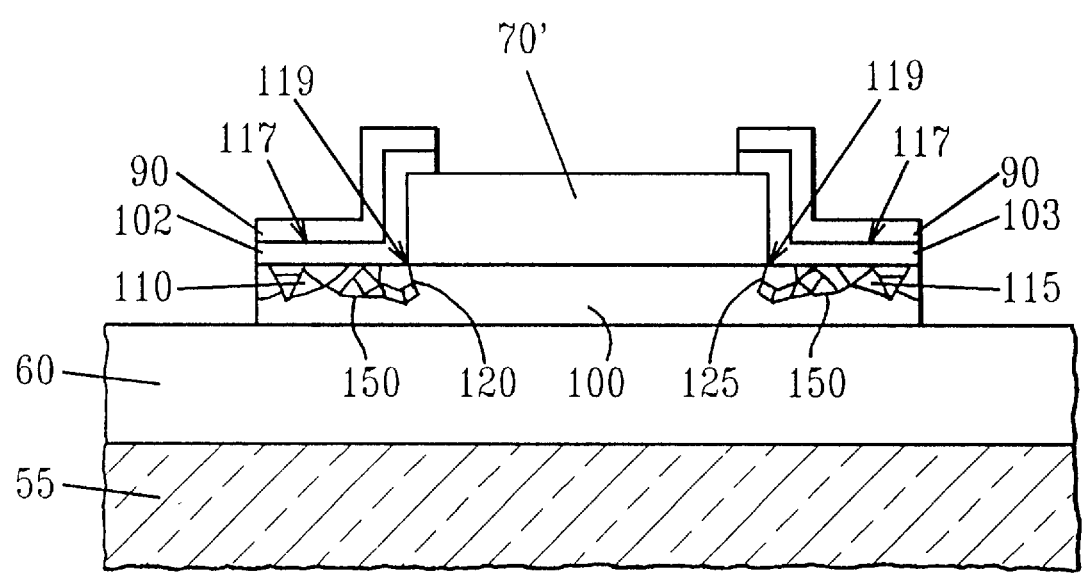
FIG. 4 shows a detailed view of one of the steps shown in FIGS. 2a–2i in accordance with the present invention.

FIG. 4 shows formation of the silicide regions 102, 103, and the initial transformation resulting from the early stage of the first pulse of the PRTA process, leading to the structure shown in FIG. 2g. Subsequent PRTA pulses cause lateral growth of the polysilicon regions 120, 125, also shown in FIG. 2h, to eventually form the polysilicon island 130 shown in FIG. 2i.

After 1 pulse, the frontiers 120, 125 of the polysilicon zones 110, 115 move several micrometers toward the center of the a-Si island 100, away from an Ni/n$^+$ contact at the edge 119 of the SiN$_x$ section 70'. Therefore, the short period of high temperature, i.e., 800° C. in this PRTA process accomplishes silicide formation and initialization of silicon crystallization, in addition to the growth for polysilicon into the island area 100. The additional pulses in the multi-pulse PRTA process mainly contribute to the growth of the polysilicon in the island area 100.

The silicide film 102 is usually in the crystalline form, which serves as the seed to initiate the crystallization of silicon. The silicide reaction is material and temperature dependent. The silicide formation is also dependent on the silicon crystallinity. When titanium (Ti) is used as the seed layer, thin polysilicon zone frontiers 120, 125 (FIG. 2h) extend to several micrometers after 16 pulses.

Figure 5:
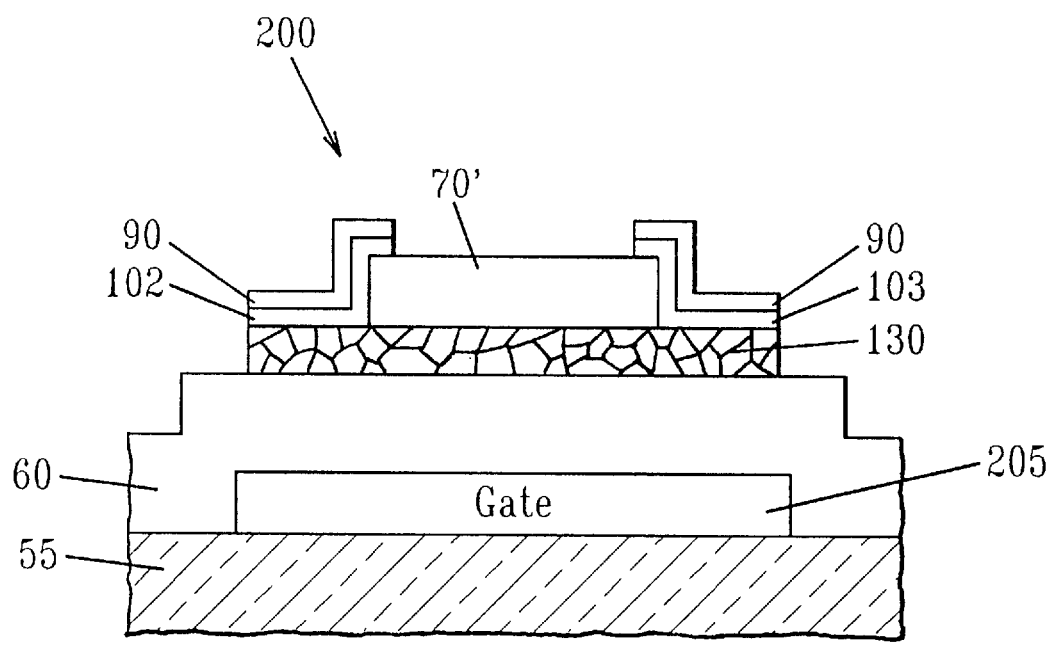
FIG. 5 shows a bottom gate polysilicon thin film transistor formed in accordance with the present invention.

The structure shown in FIG. 2i can be used to fabricate TFTs with either a bottom or a top gate structure. FIG. 5 shows a bottom gate polysilicon TFT device 200 having a gate 205 located over the glass layer 55. The bottom gate polysilicon TFT device 200 is fabricated by forming a metal gate layer over the glass layer 55 prior to the deposition of the tri-layer 50 described in connection with FIG. 2a.

This metal gate layer is selectively etched to form the gate 205 by conventional photolithography, i.e., by masking with a photoresist and etching. The remaining steps in the formation of the bottom gate polysilicon TFT device 200 are identical to then steps described above leading in connection with FIGS. 2b–2i.

The silicide regions 102, 103 act as the source and drain regions, respectively. The channel of the TFT is included in the polysilicon island 130.

Figure 6:
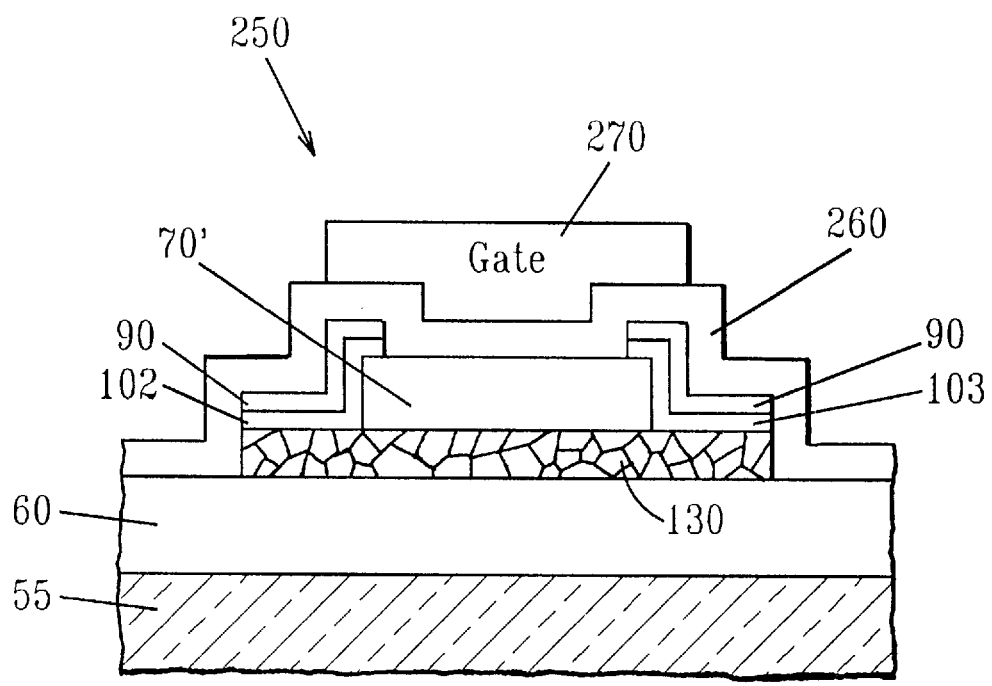
FIG. 6 shows a top gate polysilicon thin film layer transistor formed in accordance with the present invention.

FIG. 6 shows a top gate polysilicon TFT device 250 which is fabricated using the steps described in connection with FIGS. 2a–2i. In addition, the following steps are performed where a layer of insulating material 260 is formed over the structure shown in FIG. 2i. Illustratively, the insulating material 260 is silicon oxide or silicon nitride. Next, a metal gate layer is formed and selectively etched, e.g., via conventional photolithographic steps, to form a top gate 270. An optional step is to etch part of the dielectric layer 260 using the same mask used for patterning the top gate 270. Etching part of the dielectric layer 260 exposes both source and drain metals. This allows all three TFT electrodes, i.e., gate, source and drain, to be probed at the same time.

The metal gate layer used to form the top or bottom gates 270, 205 may be the same or a different type of metal as the top metal layer 90. The bottom and top gate polysilicon TFT devices 200, 250 of FIGS. 5, 6 are self-aligned.

After forming the bottom or top gate polysilicon TFT devices 200, 250, another annealing step may be performed if desired. This annealing step repairs any leakage current in the polysilicon TFTS, and may be a plasma hydrogen annealing step, for example.

Figure 7A:
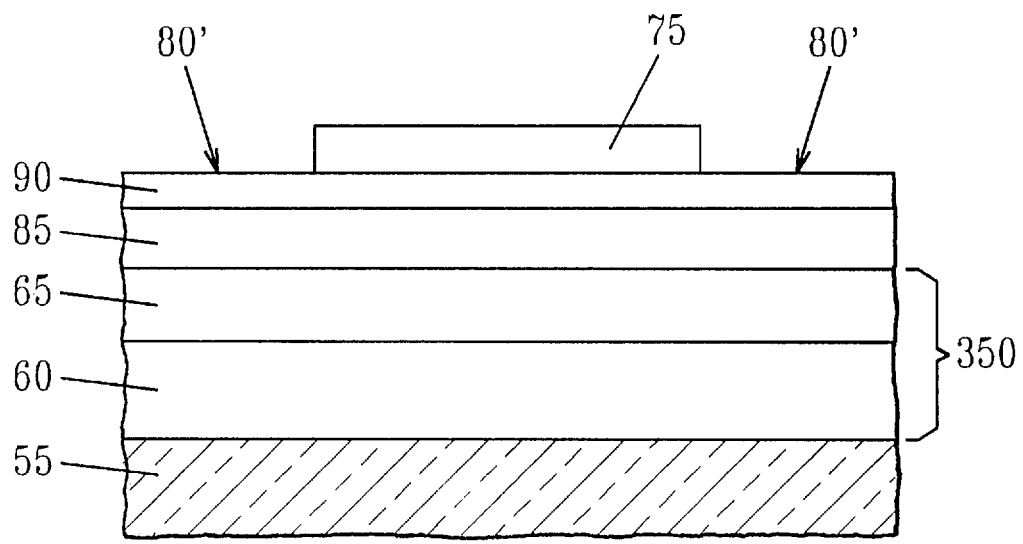
FIGS. 7a–7d show a pulsed rapid thermal annealing process in accordance with another embodiment of the present invention.

FIGS. 7a–7d show an alternate embodiment using PRTA. The TFT forming method of this embodiment is similar to the method described in connection with FIGS. 2a–2i and FIGS. 5–6. As shown in FIG. 7a, instead of forming the tri-layer structure 50 of FIG. 2a, a bi-layer structure 350 is formded over the glass layer 55. The bi-layer structure 350 does not have the top dielectric layer 70 of the tri-layer structure 50 of FIG. 2a.

The bi-layer structure 350 includes dielectric, e.g., SiN$_x$, and hydrogenated amorphous silicon (a-Si:H) layers 60, 65. Next, a heavily doped n$^+$ and metal layers 85, 90 are formed over the a-Si:H layer 65. The n$^+$ layer 85 may be formed using different methods, such as a PECVD deposition method, an ion implantation method, or a non-mass-separation ion shower implantation method. These steps sequentially form the SiN$_x$ 60, a-Si:H 65, n$^+$ 85 and metal 90 layers over the glass substrate. A mask 75 is formed on the metal layer 90 to define the hydrogenated amorphous silicon (a-Si:H) island 100 of FIG. 7b by etching through the metal, n$^+$ and a-Si:H layers 90, 85, 65.

Figure 7B:
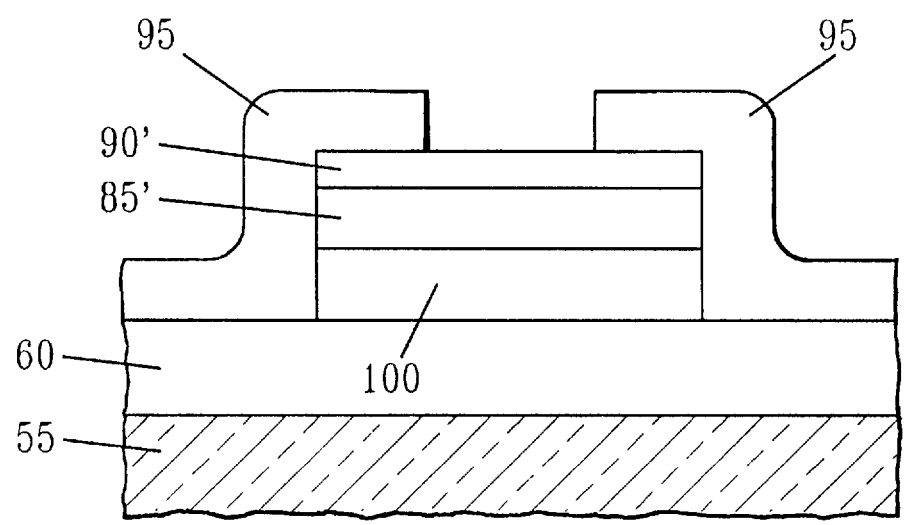

As shown in FIGS. 7a and 7b, portions 80' of the metal, n$^+$ and a-Si:H layers 90, 85, 65 not covered by the mask 75 are etched. This patterns the metal, n$^+$ and a-Si:H layers 90, 85, 65 and forms metal section 90', n$^+$ section 85', and a-Si:H island 100. Another mask 95 is formed over the exposed SiN$_x$ layer 60 and portions of the metal section 90'.

Figure 7C:
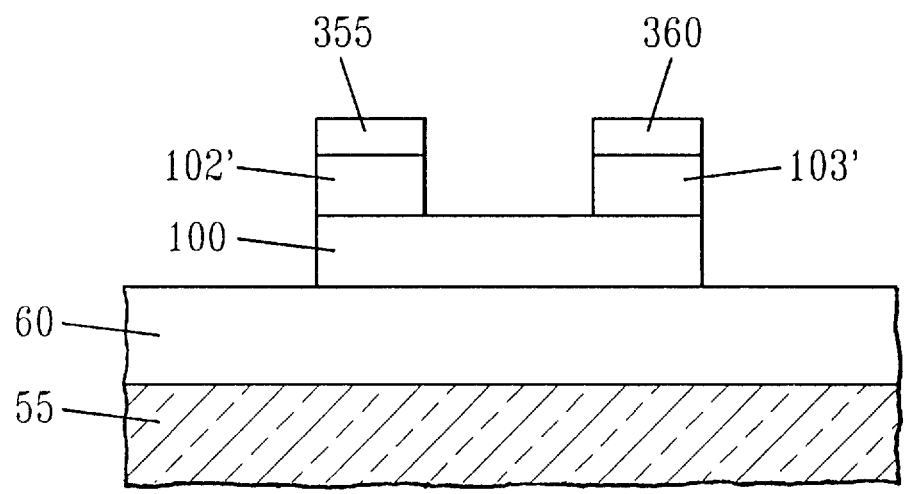

As shown in FIG. 7c, portions of the metal section 90' and n$^+$ section 85' not covered by the mask 95 are etched to form source and drain regions. The source region includes the source metal 355 and n$^+$ section 102', and the drain region includes the drain metal 360 and n$^+$ section 103'. Thereafter, the mask 95 (FIG. 7b) is removed.

Figure 7D:
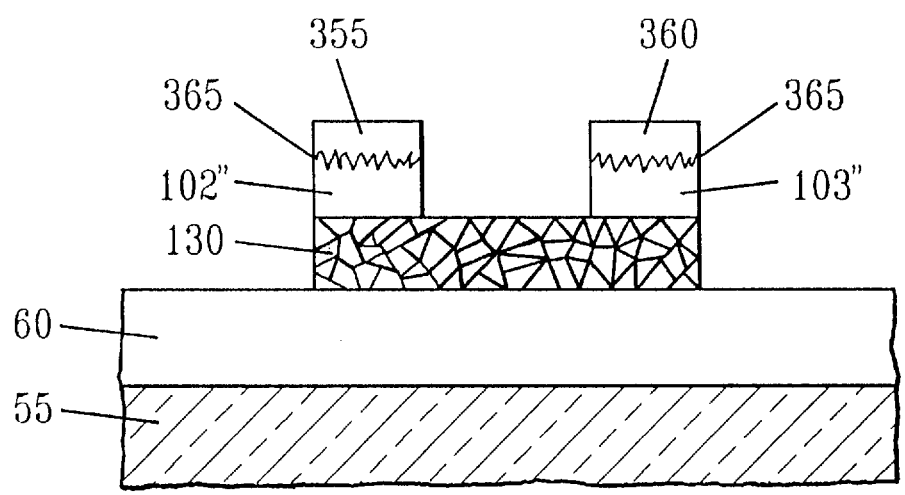

Next, the structure shown in FIG. 7c in annealed in an oven to remove hydrogen from the a-Si:H island 100, n$^+$ sections 102', 103', and SiN$_x$ layer 60. As shown in FIG. 7d, a PRTA step is performed to crystallize the silcon island 100 thus forming the polysilicon island 130. This PRTA step is described in detail in connection with FIGS. 2g–2i and FIG. 4. The PRTA step also forms suicides 365 at the boundaries of the source/drain metals 355, 360 and the n$^+$ regions 102', 103'. Further annealing using PRTA, or depending on the PRTA conditions, all the n$^+$ regions 102', 103', and even part of the a-Si island 100, transform to silicide. In addition, the PRTA step crystallize the n$^+$ regions 102', 103', thus forming polysilicon n$^+$ regions 102Δ, 103".

Figure 8:
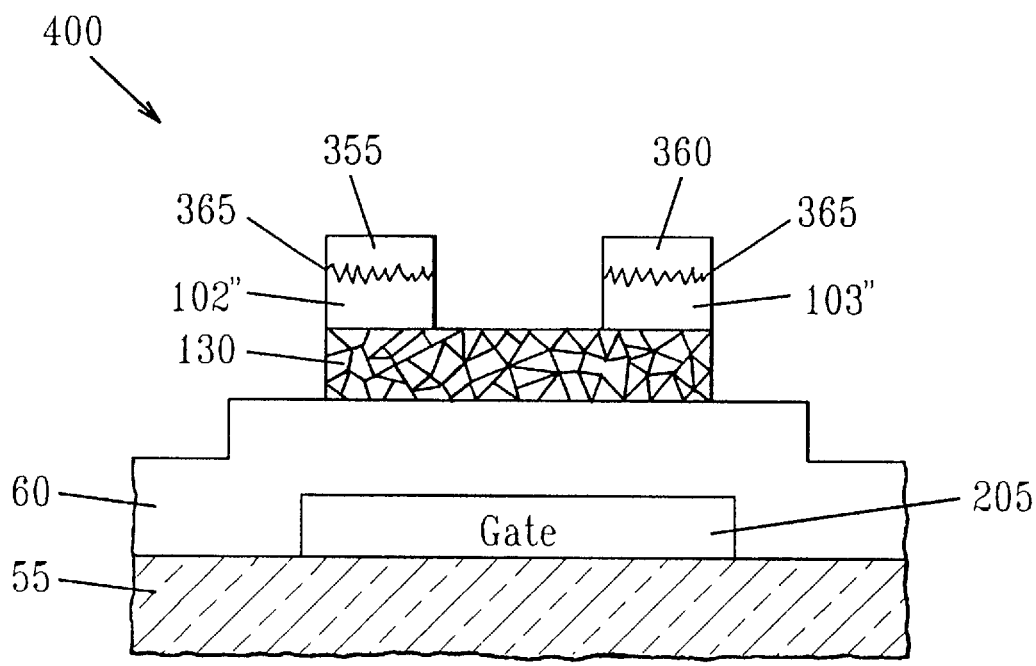
FIG. 8 shows a bottom gate polysilicon thin film transistor formed in accordance with the embodiment of the present invention of FIGS. 7a–7d.

As shown in FIG. 8, a bottom gate polysilicon TFT 400 is fabricated by forming a bottom gate 205 over the substrate 55 before the deposition of the bi-layer 350 of FIG. 7a. Steps similar to those described in detail connection with FIG. 5 are used to form the bottom gate 205.

Figure 9:
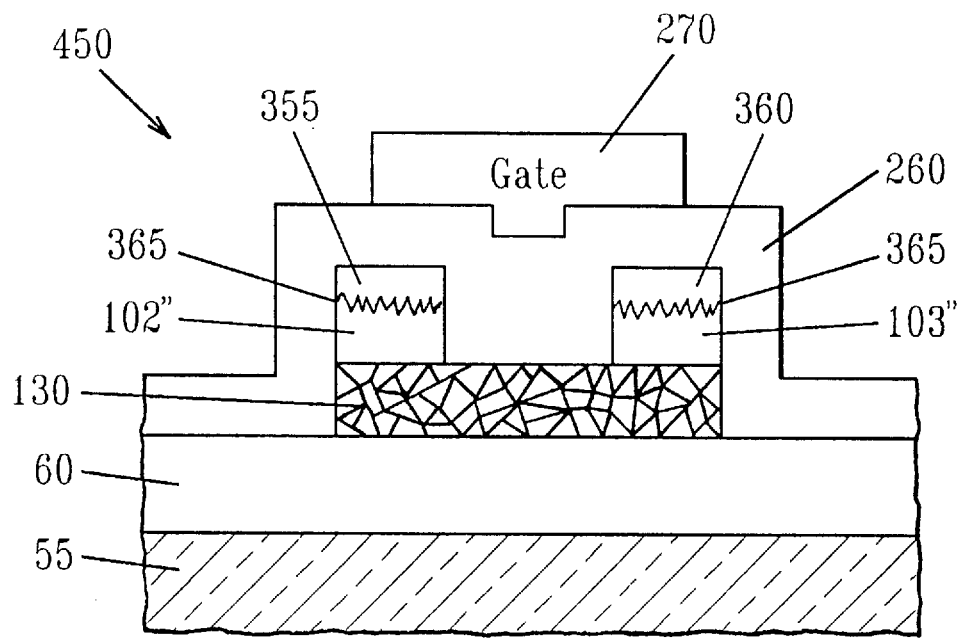
FIG. 9 shows a top gate polysilicon thin film layer transistor formed in accordance with the embodiment of the present invention of FIGS. 7a–7d.

As shown in FIG. 9, a top gate polysilicon TFT 450 is fabricated by forming, over the structure shown in FIG. 7d, an additional dielectric layer 260 followed by a top gate metal layer. Next, the top gate metal layer is patterned, e.g., masked and etched, to form a top metal gate 270. Steps similar to those described in detail connection with FIG. 6 are used to form the top gate 270. An optional step includes etching a portion of the dielectric layer 260 using the same mask as that for etching the top metal gate 270. This exposes both source and drain metals, allowing all three TFT electrodes (i.e., gate, source and drain) to be probed simultaneously.

A plasma hydrogenation step may be used to passivate dangling bonds in the polysilicon layers. This completes the fabrication of the bottom gate or top gate polysilicon TFTS 400, 450.

In summary, the inventive method causes rapid crystallization of silicon to form polysilicon from amorphous silicon in a short period of time. The inventive method is based on a pulsed rapid thermal annealing (PRTA) process in combination with a metal seed layer.

A Polysilicon channel as long as 50 micrometers can be formed in a few pulses. This method can be used in fabricating polysilicon thin film transistors (TFTs) on low-temperature, large-area glass substrates with a high throughput.

PRTA is based on the principle of repeating the short period of heating-cooling cycles in a controlled way. Polysilicon is grown laterally from the metal-silicon contact region. The lateral length of the polysilicon region increases with the number of pulses. In one example, a 50 micrometer polysilicon channel was formed with a PRTA process that contained 5 pulses of the (1 second 800° C. heating/5 seconds cooling) cycle using nickel (Ni) as the contact metal. This is more than 4 orders of magnitude shorter than the time required by the 500° C. furnace annealing method using the same thin film structure. The PRTA grown polysilicon contains small grains and amorphous phase silicon. For the 50 micrometer silicon channel, the resistivity dropped more than two orders of magnitude after the 3-pulse annealing. Other metals, such as Pd and Ti, may also be used as the metal seed layer and as the top or bottom gates. The numbers of PRTA pulses needed using these metals is larger than the number of pulses needed using Ni to grow the same length of polysilicon channel. The transformation of silicon from amorphous to crystalline may depend on the structure of the silicide.

Since the PRTA process is controlled by the local reaction between the seed metal and silicon, it can be applied to prepare small geometry devices without deteriorating the large area uniformity. To obtain good device characteristics, process parameters may be adjusted, such as the RTA temperature, the heating and cooling periods of each cycle, the silicon and dielectric materials, the selection of seed metal, and thermal properties of the glass substrate. Low temperature glass is not damaged during the PRTA process using a small number of high temperature/low duration pulses because the glass exposed to the high temperature for only a short period of time. The PRTA method can also be used to prepare devices on high temperature glass. In this case, the advantage is that the silicon crystallization time is much shorter than that of a furnace annealing method.

While the invention has been particularly shown and described with respect to illustrative and preferred embodiments thereof, it will be understood by those skilled in the art that the foregoing and other changes in form, material, and details may be made therein without departing from the spirit and scope of the invention which should be limited only by the scope of the appended claims.

Having thus described my invention, what I claim as new, and desire to secure by Letters Patent is:

1. A method of forming a thin film semiconductor device comprising the steps of:
   (a) forming over a glass layer a tri-layer structure having a layer of amorphous silicon sandwiched between bottom and top dielectric layers;
   (b) selectively etching said top dielectric layer to expose portions of said amorphous silicon layer;
   (c) forming a metal seed layer over said exposed portions of said amorphous silicon layer; and
   (d) pulsed rapid thermal annealing comprising successive pulses separated by rest periods to transform said amorphous silicon layer to a polysilicon layer.

2. The method of claim 1, wherein said trilayer forming step forms said tri-layer over a glass having a predetermined, strain temperature, and wherein said annealing step anneals at a temperature exceeding said predetermined strain temperature.

3. The method of claim 1, wherein the pulsed rapid thermal annealing step comprises said successive pulses having a duration of approximately one second separated by said rest periods having a duration of approximately five seconds.

4. The method of claim 3, wherein said pulsed rapid thermal annealing step forms said polysilicon layer having a length of 50 $\mu$m in five of said successive pulses.

5. The method of claim 1 after said selectively etching step, further comprising the step of furnace annealing prior to said step of forming a metal seed layer.

6. The method of claim 1, wherein said selectively etching step comprises the steps of:
   forming mask over portions of said top dielectric layer;
   etching unmasked portions of said top dielectric layer; and
   removing said mask.

7. The method of claim 1, after said selectively etching step, further comprising forming a heavily doped silicon layer over said exposed portions of said amorphous silicon layer, prior to said step of metal seed layer forming step.

8. The method of claim 7, before said step of forming the heavily doped silicon layer, further comprising the step of furnace annealing.

9. The method of claim 1, after said pulsed rapid thermal annealing step, further comprising the steps of:
   forming an insulating layer over said metal seed layer and said top dielectric layer; and
   forming a gate layer over said insulating layer.

10. The method of claim 1, before said step of forming the tri-layer structure, forming a gate layer over said glass layer.

11. The method of claim 1, wherein said metal seed layer comprises one of nickel, titanium and palladium.

12. A method of transforming an amorphous silicon layer to a polysilicon layer comprising the steps of:
   forming a metal layer over said amorphous silicon layer; and
   pulsed rapid thermal annealing said metal and amorphous silicon layers using successive thermal pulses having a duration of approximately one second and separated by approximately five seconds.

13. A method of crystallizing an amorphous silicon layer formed over a glass layer having a predetermined strain temperature, comprising the steps of:
   forming a metal layer over said amorphous silicon layer; and
   pulsed rapid thermal annealing said metal and amorphous silicon layers using successive thermal pulses having a temperature that exceeds said predetermined temperature, each pulse being for a duration sufficiently short in time to crystallize said amorphous silicon layer without damaging said glass.

14. A method of of forming a thin film semiconductor device comprising the steps of:
   (a) sequentially forming over a glass layer a dielectric layer, an amorphous silicon layer, a heavily doped silicon layer, and a metal layer;
   (b) patterning said amorphous silicon, heavily doped silicon, and metal layers;
   (c) patterning said patterned heavily doped silicon and metal layers to form a source, a drain, and source and drain contacts, separated by an exposed portion of said amorphous silicon layer; and
   (d) pulsed rapid thermal annealing comprising successive pulses separated by rest periods to transform said amorphous silicon layer to a polysilicon layer.

15. The method of claim 14, after said pulsed rapid thermal annealing step, further comprising the steps of:
   forming a gate dielectric layer over said exposed amorphous silicon portion and said source and drain contacts; and
   forming a gate over said gate dielectric layer.

16. The method of claim 14, before the sequentially forming step, further comprising the step of forming a gate over said substrate.

17. The method of claim 16, wherein the gate forming step comprises forming a gate layer over said substrate; and patterning said gate layer to form said gate.

* * * * *